United States Patent
Hirose et al.

(10) Patent No.: US 11,290,675 B2
(45) Date of Patent: Mar. 29, 2022

(54) SOLID-STATE IMAGE SENSOR AND IMAGING SYSTEM

(71) Applicant: Panasonic Intellectual Property Management Co., Ltd., Osaka (JP)

(72) Inventors: Yutaka Hirose, Kyoto (JP); Akihiro Odagawa, Osaka (JP); Shinzo Koyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/274,133

(22) PCT Filed: Sep. 5, 2019

(86) PCT No.: PCT/JP2019/034984
§ 371 (c)(1),
(2) Date: Mar. 5, 2021

(87) PCT Pub. No.: WO2020/050362
PCT Pub. Date: Mar. 12, 2020

(65) Prior Publication Data
US 2021/0368119 A1    Nov. 25, 2021

(30) Foreign Application Priority Data
Sep. 6, 2018 (JP) .............................. JP2018-167137

(51) Int. Cl.
*H04N 5/378* (2011.01)
*H04N 5/351* (2011.01)
(Continued)

(52) U.S. Cl.
CPC ............ *H04N 5/378* (2013.01); *H04N 5/351* (2013.01); *H04N 5/3745* (2013.01)

(58) Field of Classification Search
CPC .... H04N 5/378; H04N 5/3551; H04N 5/3745; H04N 5/37455; H04N 5/37457;
(Continued)

(56) References Cited

U.S. PATENT DOCUMENTS

| 9,952,323 B2* | 4/2018 | Deane | ..................... G01S 17/89 |
| 10,491,843 B2* | 11/2019 | Ikedo | ..................... H04N 5/335 |

(Continued)

FOREIGN PATENT DOCUMENTS

| JP | 2009239668 A | 10/2009 |
| JP | 2017520134 A | 7/2017 |

(Continued)

OTHER PUBLICATIONS

Extended European Search Report issued in European Patent Application No. 19857977.3, dated Jun. 11, 2021.
International Search Report dated Nov. 12, 2019 in International Application No. PCT/JP2019/034984, with English translation.

*Primary Examiner* — Marly S Camargo
(74) *Attorney, Agent, or Firm* — McDermott Will & Emery LLP (57) ABSTRACT

A solid-state image sensor capable of detecting a photon and having smaller circuit scale is provided. The solid-state image sensor includes a pixel array including a plurality of pixel cells, a pixel driving circuit configured to drive the plurality of pixel cells, a readout circuit, and a plurality of readout wires corresponding to respective columns of the pixel cell. Each of the plurality of pixel cells includes an avalanche photodiode configured to detect a photon by avalanche multiplication occurring when one photon enters, and a transfer transistor configured to transfer a detection result of the photon to the corresponding readout wire. The readout circuit determines whether a photon is detected or not, and outputs a determination result.

7 Claims, 9 Drawing Sheets

(51) Int. Cl.
    *H04N 5/374*      (2011.01)
    *H04N 5/335*      (2011.01)
    *H04N 5/369*      (2011.01)
    *H01L 27/146*     (2006.01)
    *G01S 17/00*      (2020.01)
    *G01S 17/89*      (2020.01)
    *H04N 5/3745*     (2011.01)

(58) Field of Classification Search
    CPC ...... H04N 5/335; H04N 5/3696; H04N 5/351;
               H01L 27/14609; H01L 27/14643; G01S
               17/00; G01S 17/89
    USPC .............. 348/300, 302, 308, 294, 298, 297;
               257/186, 199, 322, 438, 481, 492, 493,
               257/551, 589; 250/208.1, 214.1, 214 R;
               377/127, 47, 297
 See application file for complete search history.

(56) References Cited

U.S. PATENT DOCUMENTS

| | | | |
|---|---|---|---|
| 10,812,729 B2 * | 10/2020 | Kasuga | H04N 5/2351 |
| 11,169,022 B2 * | 11/2021 | Goden | H03K 17/78 |
| 2004/0036786 A1 * | 2/2004 | Takayanagi | H04N 5/35518 |
| | | | 348/308 |
| 2015/0285625 A1 | 10/2015 | Deane | |
| 2017/0131143 A1 * | 5/2017 | Andreou | G01J 1/44 |
| 2017/0187939 A1 | 6/2017 | Kasuga et al. | |
| 2018/0348381 A1 | 12/2018 | Nishihara et al. | |
| 2020/0252563 A1 * | 8/2020 | Yasuda | H04N 5/36961 |

FOREIGN PATENT DOCUMENTS

| | | |
|---|---|---|
| WO | 2016042734 A1 | 3/2016 |
| WO | 2017104438 A1 | 6/2017 |

\* cited by examiner

SOLID-STATE IMAGE SENSOR AND IMAGING SYSTEM

CROSS REFERENCE TO RELATED APPLICATIONS

This application is the U.S. National Phase under 35 U.S.C. § 371 of International Application No. PCT/JP2019/034984, filed on Sep. 5, 2019, which in turn claims the benefit of Japanese Application No. 2018-167137, filed on Sep. 6, 2018, the entire contents of each are hereby incorporated by reference.

TECHNICAL FIELD

The present disclosure relates to a solid-state image sensor, and particularly to a solid-state image sensor including a device in which avalanche multiplication occurs with one photon.

BACKGROUND ART

In recent years, there has been proposed a solid-state image sensor which includes pixels capable of being used for photon counting by arranging pixel cells each including an avalanche photodiode (hereinafter referred to as APD) in an array. Patent Documents 1 and 2 describe examples of such a solid-state image sensor.

In the imaging apparatus of Patent Document 1, for example, an APD arranged in each of the pixel cells multiply charges generated by photoelectric conversion, and a determination circuit disposed in the pixel cell determine whether photons are detected or not so that a result of this determination is stored or added in a memory in the pixel cell. In the case of adding the result, a series of such operations, that is, detection, determination, and addition, is repeated multiple times. Information accumulated in the memories of the pixel cells are output as an image of one frame.

CITATION LIST

Patent Documents

PATENT DOCUMENT 1: Japanese Patent Publication No. 2009-239668
PATENT DOCUMENT 2: International Patent Publication No. 2016/042734

SUMMARY OF THE INVENTION

Technical Problem

In a solid-state image sensor as described above, however, each pixel cell has a relatively large circuit scale, and thus, it is difficult to miniaturize the pixel cells. In addition, since the pixel cell needs to wait for entry of a plurality of photons, the time necessary for readout of an image is relatively long. Furthermore, an AD converter is needed in order to digitize a voltage corresponding to the number of photons which have entered.

It is therefore an object of the present disclosure to provide a solid-state image sensor capable of detecting a photon and miniaturizing pixel cells.

Solution to the Problem

A solid-state image sensor according to the present disclosure includes: a pixel array including a plurality of pixel cells; a pixel driving circuit configured to drive the plurality of pixel cells; a readout circuit configured to read data from the plurality of pixel cells and output an image constituted by pixels corresponding to the plurality of pixel cells; and a plurality of readout wires corresponding to respective columns of the pixel cells, the plurality of readout wires connecting the pixel cell and the readout circuit to each other. Each of the plurality of pixel cells includes an avalanche photodiode configured to detect a photon by avalanche multiplication occurring when one photon enters, and a transfer transistor configured to transfer a detection result of the photon by the avalanche photodiode to a corresponding one of the readout wires. For each of the plurality of pixel cells of the pixel array, the readout circuit determines whether a photon is detected or not based on a voltage of one of the readout wires corresponding to the pixel cell, and outputs a determination result as a value of a pixel corresponding to the pixel cell.

This configuration eliminates the necessity for determination on whether a photon is detected or not and holding of a determination result in pixel cells. Thus, the pixel cells can be made in a small circuit scale and further miniaturized. Since the solid-state image sensor according to the present disclosure does not need to wait for entry of a plurality of photons, the time necessary for readout of an image can be further reduced. Data on whether a photon is detected or not for each pixel cell is output, and thus, no AD converter for digitization is needed.

Advantages of Invention

According to the present disclosure, an image can be output at high speed, and thus, an image can be obtained in association with a distance to a subject.

DESCRIPTION OF EMBODIMENTS

An embodiment will be described hereinafter with reference to the drawings. In the drawings, like reference characters have been used to designate identical or equivalent elements. Features of an embodiment described below may be combined as long as no contradiction arises.

Figure 1:
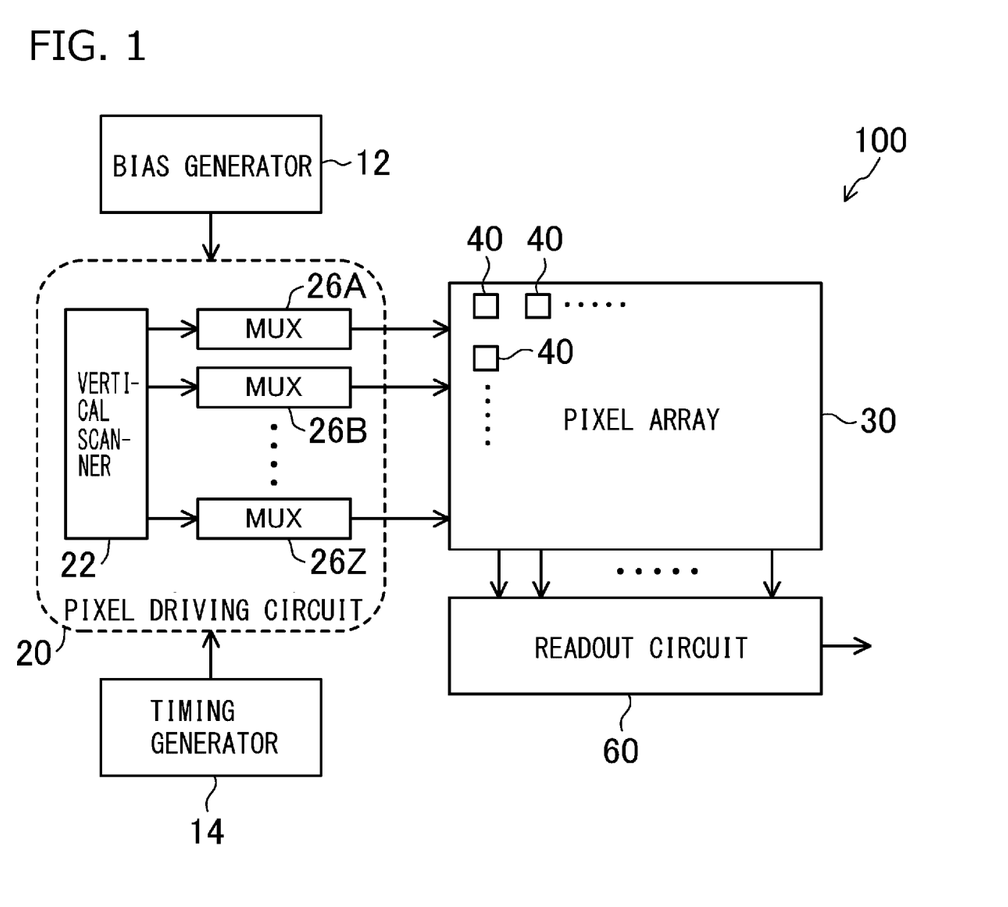
FIG. 1 is a block diagram illustrating an example configuration of a solid-state image sensor according to an embodiment.

FIG. 1 is a block diagram illustrating an example configuration of a solid-state image sensor according to an embodiment. A solid-state image sensor 100 illustrated in FIG. 1 includes a bias generator 12, a timing generator 14, a pixel driving circuit 20, a pixel array 30, and a readout circuit 60. The pixel array 30 includes a plurality of pixel cells 40 arranged in rows and columns, for example. The pixel driving circuit 20 includes a vertical scanner 22 and multiplexers 26A, 26B, ..., and 26Z corresponding to different columns of the pixel cells 40, and drives the plurality of pixel cells 40. The readout circuit 60 reads data from the plurality of pixel cells 40.

The bias generator 12 supplies a necessary voltage to each circuit in the solid-state image sensor 100. The timing generator 14 generates a clock signal and supplies the clock signal to each circuit in the solid-state image sensor 100. The timing generator 14 also generates signals necessary for controlling the pixel cells 40, and supplies the signals to the pixel cells 40 through the multiplexers 26A, 26B, ..., and 26Z. The vertical scanner 22 generates a signal necessary for controlling the pixel cells 40 row by row, and supplies the signal to the pixel cells 40 through the multiplexers 26A, 26B, ..., and 26Z.

Figure 2:
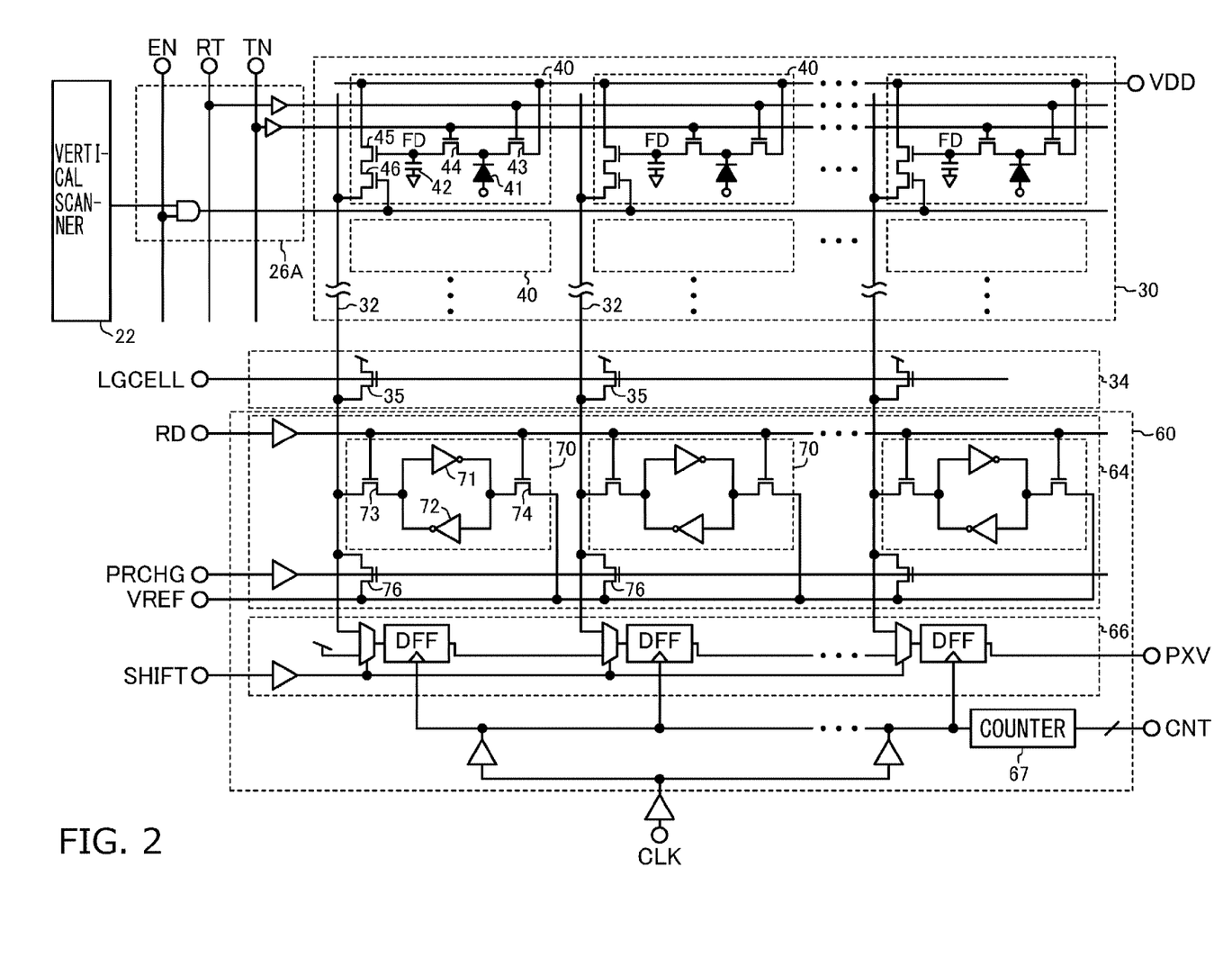
FIG. 2 is a specific circuit diagram of a pixel driving circuit, a pixel array, and a readout circuit illustrated in FIG. 1.

FIG. 2 is a more specific circuit diagram of the pixel driving circuit 20, the pixel array 30, and the readout circuit 60 illustrated in FIG. 1. The solid-state image sensor 100 includes a plurality of readout wires 32 and a load circuit 34. The plurality of readout wires 32 correspond to the respective columns of the pixel cells 40, and connect the pixel cells 40 to the readout circuit 60. The load circuit 34 includes a plurality of load transistors 35 respectively connected to the readout wires 32. Each of the pixel cells 40 includes an avalanche photodiode (APD) 41, a floating diffusion (FD) 42, a pixel reset transistor 43, a transfer transistor 44, an amplifying transistor 45, and a selecting transistor 46. A substrate voltage VSUB is applied to an anode of the APD 41. The substrate voltage VSUB is, for example, −20 V.

When a photon enters the APD 41, avalanche multiplication (avalanche breakdown) occurs, the APD 41 collects charges in a cathode thereof until quenching. That is, the APD 41 detects, by photoelectric conversion, a photon which has entered the APD 41. More specifically, in a state where a large negative bias VSUB is applied to the anode of the APD 41, when one photon enters, avalanche multiplication occurs by photoelectric conversion, and the APD 41 collects charges whose amount reaches a saturation charge amount to the cathode of the APD 41. At this time, the APD 41 operates in a Geiger mode.

Figure 3:
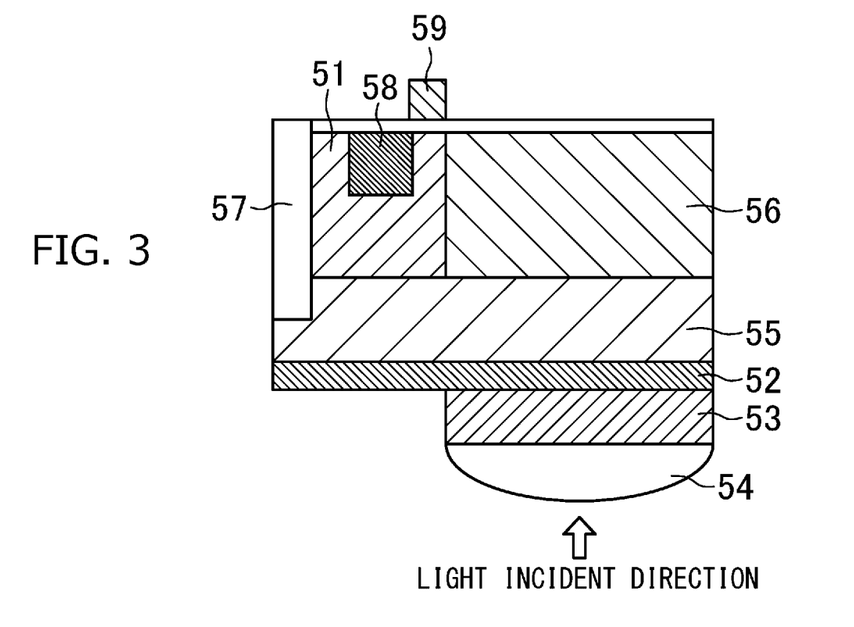
FIG. 3 is a cross-sectional view illustrating an example configuration of an avalanche photodiode illustrated in FIG. 2.

FIG. 3 is a cross-sectional view illustrating an example configuration of the avalanche photodiode 41 illustrated in FIG. 2. FIG. 3 shows a schematic cross-sectional view of the APD 41 and the transfer transistor 44 adjacent to the APD 41, in a cross section along the direction of the length of the transfer transistor 44.

An optical filter 53 and a condenser lens 54 are formed on a protective film 52 on the back surface of a substrate 51. A region 55 of the substrate near the back surface is doped in a p type, a region (front surface region) 56 near the front surface of the substrate is doped in an n type, and these two regions form a pn junction. While electrons generated by a photon which entered from the back surface travel in a high-electric field region formed by this pn junction, the number of electrons that reach the n-type front-surface region is significantly multiplied (typically multiplied to 10000 electrons) by avalanche multiplication. The transfer transistor 44 transfers these electrons to a floating diffusion (capacitance) 58 in accordance with a voltage of a gate 59 thereof. The pixel cells 40 are electrically isolated from each other by an isolator 57. As described above, the APD 41 is disposed in a photoelectric converter of a back-illuminated image sensor so that the area of a right-receiving area can be thereby increased.

Description will now return to FIG. 2. The transfer transistor 44 is connected between the cathode of the APD 41 and the FD 42. When being selected by the vertical scanner 22, the transfer transistor 44 is turned on and transfers charges of the APD 41 to the FD 42. The FD 42 accumulates charges transferred from the APD 41. The reset transistor 43 is connected between the APD 41 and a power supply of a voltage VDD, and resets potentials of the APD 41 and the FD 42.

The gate and source of the amplifying transistor 45 are connected to the FD 42 and the drain of the selecting transistor 46, respectively. The drain of the amplifying transistor 45 is supplied with, for example, a power supply voltage VDD. The power supply voltage VDD is 3 V, for example. The source of the selecting transistor 46 is connected to the readout wires 32. The readout wire 32 is a signal wire common to a plurality of pixel cells 40 belonging to the same column. The amplifying transistor 45 outputs a current to the corresponding readout wire 32 in accordance with the potential of the FD 42. The gates of the transfer transistor 44, the reset transistor 43, and the selecting transistor 46 receive a transfer signal TN, a reset signal RT, and a selection signal from the vertical scanner 22, respectively.

That is, the transfer transistor 44 transfers a detection result of the photon by the APD 41 to the corresponding readout wire 32 by way of the amplifying transistor 45 and the selecting transistor 46. The voltage of each readout wire 32 changes depending on the detection result of the photon. The readout wires 32 are connected to the load transistors 35, and the load transistors 35 constitute source followers together with the amplifying transistor 45 through the readout wires 32.

The readout circuit 60 includes a column amplifier array 64, a horizontal transfer circuit 66, and a counter 67. The column amplifier array 64 includes a column amplifier 70 and a precharge circuit 76 for each of the readout wires 32. The column amplifier 70 includes inverters 71 and 72 and transistors 73 and 74. The precharge circuit 76 includes a precharge transistor.

The precharge circuit 76 precharges the corresponding readout wire 32 with a precharge voltage. The column amplifier 70 includes a bistable circuit constituted by the inverters 71 and 72, and changes the voltage of the corresponding readout wire 32 to a logical high or low voltage and holds the voltage. That is, for each of the plurality of pixel cells 40 of the pixel array 30, the column amplifier 70 of the readout circuit 60 determines whether a photon is detected or not based on the voltage of the readout wire 32 corresponding to the pixel cell 40, changes the voltage of the readout wire 32 to one of the logical high or low voltages associated with a determination result, and holds the resulting voltage.

The horizontal transfer circuit 66 sequentially transfers voltages of the readout wires 32 in response to a clock CLK, and outputs the transferred voltage as a determination result PXV indicating whether a photon is detected or not. The counter 67 is reset at each readout of a frame, increases a count value CNT in response to the clock CLK, and outputs the increased count value CNT. The count value CNT is associated with an address indicating a position of each pixel cell 40 in the pixel array 30. That is, for each of the pixel cells 40, the readout circuit 60 sequentially outputs a determination result on whether a photon is detected or not and an address indicating the position of the pixel cell 40. The solid-state image sensor 100 repeats the operation described above while changing rows of the pixel cells 40 selected by the vertical scanner 22.

In a typical complementary metal oxide semiconductor (CMOS) image sensor, in order to output an analog value, it is necessary to amplify voltages of readout wires while keeping linearity, and thus, an analog amplifier with high accuracy and high gain is needed. On the other hand, since the solid-state image sensor 100 is configured to output a detection result corresponding to whether a photon is detected or not with respect to each of the pixel cells 40, the column amplifier 70 may be a nonlinear circuit using the inverters 71 and 72. The use of the column amplifier 70 described above enables a signal from each pixel cell to be read out at higher speed.

The solid-state image sensor 100 has a configuration similar to that of the typical CMOS image sensor. The pixel cells 40 of the solid-state image sensor 100 include none of a circuit for determining whether a photon is detected or not, a circuit for holding a determination result, and a circuit for counting and holding the number of photons. Thus, the circuit scale of the pixel cells 40 is substantially equal to that of the typical CMOS sensor. This enables miniaturization of pixel cells and reduction of power consumption. Since it is unnecessary to wait for entry of a plurality of photons, the time necessary for signal readout operation is short, and the speed of readout operation can be increased in the entire solid-state image sensor 100.

Figure 4:
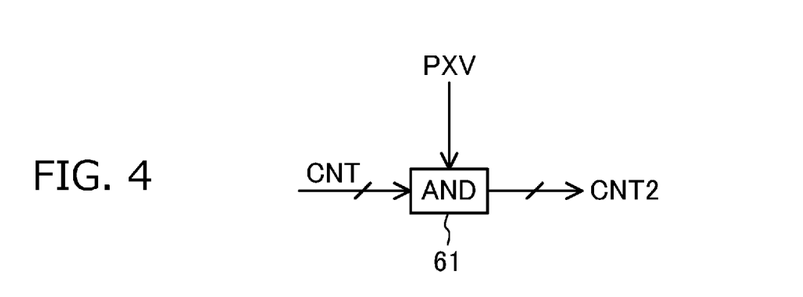
FIG. 4 is a circuit diagram illustrating an example of an output circuit that may be included in the readout circuit illustrated in FIG. 2.

FIG. 4 is a circuit diagram illustrating an example of an output circuit that may be included in the readout circuit 60 illustrated in FIG. 2. The readout circuit 60 may further include an output circuit illustrated in FIG. 4. The output circuit illustrated in FIG. 4 includes an AND circuit 61. The AND circuit 61 outputs a count value CNT of the counter 67 as a count value CNT2 without change only in a case where an output PXV of the horizontal transfer circuit 66 indicates detection of a photon. That is, only for a pixel cell 40 for which it is determined that a photon has been detected, the readout circuit 60 outputs an address indicating a position of this pixel cell 40 as a count value CNT2.

The AND circuit 61 may output a count value CNT of the counter 67 as a count value CNT2 without change only in a case where the output PXV of the horizontal transfer circuit 66 does not indicate detection of a photon. In this case, only for a pixel cell 40 for which it is determined a photon has not been detected, the readout circuit 60 outputs an address indicating a position of this pixel cell 40 as a count value CNT2.

Figure 5:
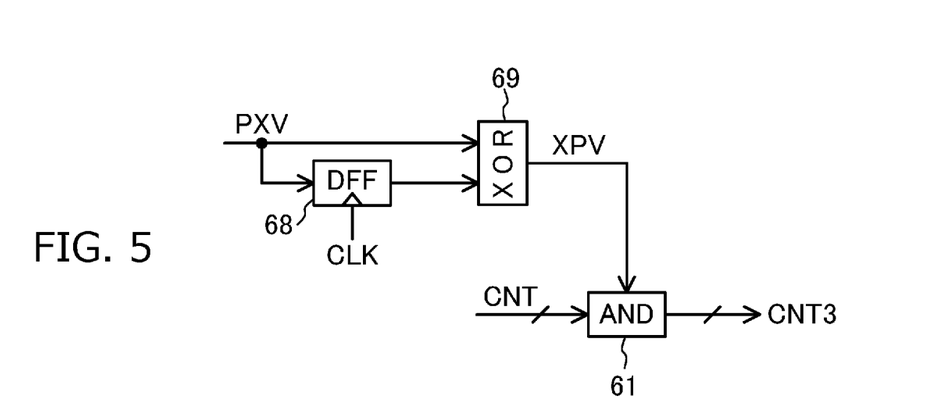
FIG. 5 is a circuit diagram illustrating another example of the output circuit that may be included in the readout circuit illustrated in FIG. 2.

FIG. 5 is a circuit diagram illustrating another example of the output circuit that may be included in the readout circuit 60 illustrated in FIG. 2. The readout circuit 60 may further include the output circuit illustrated in FIG. 5. The output circuit illustrated in FIG. 5 includes an AND circuit 61, a D flip-flop (DFF) 68, and an exclusive OR (XOR) circuit 69. The DFF 68 delays an output of the horizontal transfer circuit 66 by one clock and outputs the delayed output. The XOR circuit 69 outputs an exclusive OR XPV of an output of the horizontal transfer circuit 66 and the DFF 68. The AND circuit 61 outputs a count value CNT of the counter 67 as a count value CNT3 without change only in a case where the exclusive OR XPV is "1," that is, the output PXV of the horizontal transfer circuit 66 changes. That is, only in a case where a detection result of a photon for a specific pixel cell 40 is different from a detection result of a photon for a pixel cell adjacent to the specific pixel cell 40, the readout circuit 60 outputs an address indicating a position of the specific pixel cell 40 corresponding to an output of the horizontal transfer circuit 66 at this time, as a count value CNT3.

The presence of the output circuit illustrated in FIG. 4 or 5 in the readout circuit 60 eliminates the necessity for reading data out of the solid-state image sensor 100 from all the pixel cells, and thus, the amount of data output by the readout circuit 60 can be reduced. Accordingly, it is possible to reduce the time necessary for reading out data from the solid-state image sensor 100.

Figure 6:
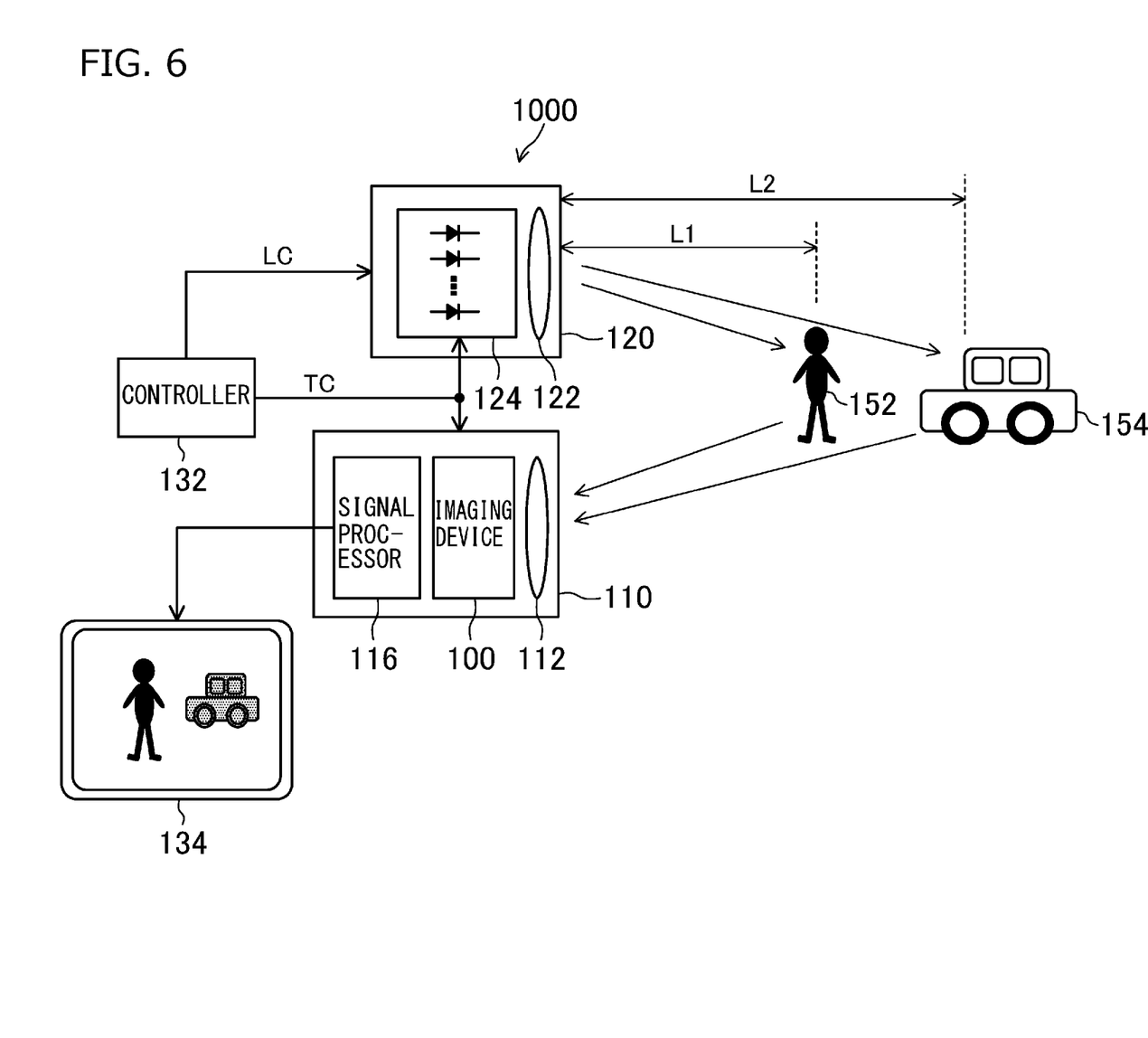
FIG. 6 is a block diagram illustrating an example configuration of an imaging system according to the embodiment.

An example of an imaging system using the solid-state image sensor 100 will be described. FIG. 6 is a block diagram illustrating an example configuration of an imaging system according to this embodiment. An imaging system 1000 illustrated in FIG. 6 includes an imaging device (camera) 110, a light projection device 120, a controller 132, and a display 134. The imaging device 110 includes the solid-state image sensor 100, a light-receiving optical system 112, and a signal processor 116. The solid-state image sensor 100 is disposed at an image plane of the light-receiving optical system 112. The light projection device 120 includes a projection optical system 122 and a light source 124.

The controller 132 outputs a timing adjustment signal to the solid-state image sensor 100 and the light source 124. The light source 124 of the light projection device 120 emits light in pulses with a predetermined period in response to the timing adjustment signal, and projects light to subjects 152 and 154. The projected light is reflected on each of the subjects 152 and 154. The reflected light is incident on the solid-state image sensor 100 through the light-receiving optical system 112.

Photons included in light fly to the solid-state image sensor 100 after a propagation time in accordance with a distance to the subjects. For example, a photon reflected on the subject 152 located at a distance L1 from the imaging system flies to the solid-state image sensor 100 after a time of 2×L1/c from light emission. A photon reflected on the subject 154 located at a distance L2 from the imaging system flies to the solid-state image sensor 100 after a time of 2×L2/c from light emission. In this case, c is a speed of light. Thus, by detecting a photon after, for example, a time of 2×L1/c from light emission of the light projection device 120, it is possible to know the distance to the subject 152. In view of this, in the imaging system of this embodiment, timings of light emission in the light projection device 120 and light reception in the solid-state image sensor 100 are adjusted based on a timing adjustment signal TC from the controller 132.

Figure 7:
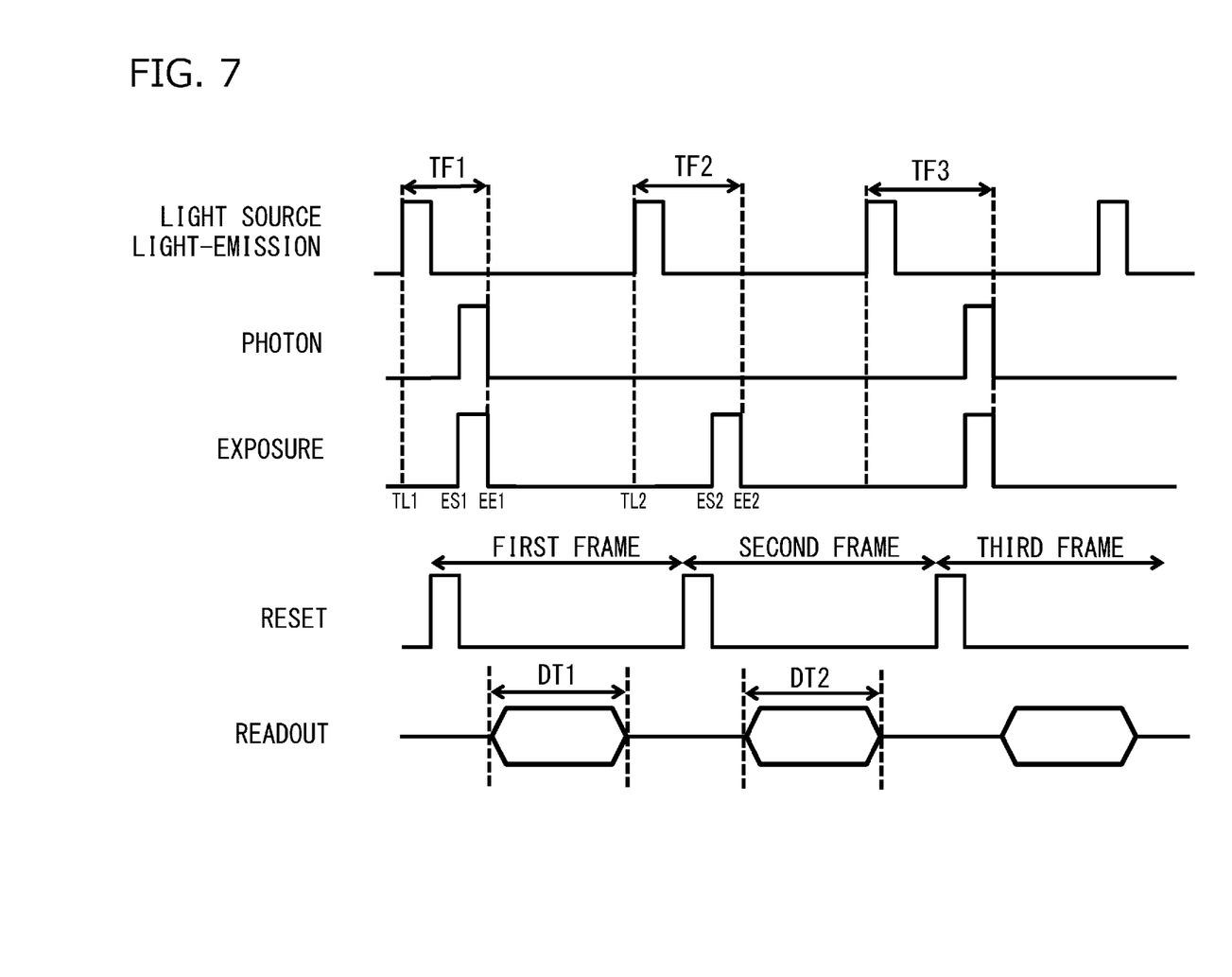
FIG. 7 is a timing chart showing examples of signals in the solid-state image sensor illustrated in FIG. 6.

FIG. 7 is a timing chart showing examples of signals in the solid-state image sensor 100 illustrated in FIG. 6. In the solid-state image sensor 100, each frame corresponds to one light exposure period. The solid-state image sensor 100 counts the number of frames of an output image from, for example, the start of taking the image, and outputs the number of frames as a frame number. In the imaging system 1000, a relationship between a frame number of each of a plurality of output frames and a time from an output of an optical pulse output to the light exposure period of the solid-state image sensor is set beforehand. In FIG. 7, the time from the output of the optical pulse to the light exposure period of the solid-state image sensor is expressed as photon fly times TF1, TF2, and TF3. More specifically, in this embodiment, relationships between a frame number and each of a light emission start time of the light source, a light exposure start time, and a light exposure end time are set beforehand.

The photon flight time TF1 is, for example, a time from a light emission start time TL1 to a light exposure end time EEL Alternatively, the photon flight time TF1 may be a time from the light emission start time TL1 to a light exposure start time ES1 or a time from the light emission start time TL1 to a time between the light exposure start time ES1 and the light exposure end time EEL The same holds for the other photon flight times.

The imaging system 1000 measures an average brightness of an imaging scene in an initialization period (not shown) before start of imaging. Based on a result of this measurement, the controller 132 controls the number of photons generated per an optical pulse of the light source 124 by a light control signal LC, and sets, at one, for example, an average of the number of photons which enter each pixel cell 40 of the solid-state image sensor 100 in the light exposure period of each frame. By setting the average in this manner, in the pixel cells 40 in each frame, although variations (shot noise) in photon flight are present, avalanche multiplication occurs because of detection of one photon at most. A pulse by the avalanche multiplication due to the variations and a spurious pulse (dark count) generated in the APDs 41 are removed by the signal processor 116 at a subsequent stage.

At the light emission start time TL1, the light source 124 emits light. The duration of the light emission period is, for example, 10 ns. In a specific pixel cell 40, when a reset operation of the reset transistor 43 in response to a reset signal RT is finished, a light exposure period starts. Only in a light exposure period corresponding to each frame, a negative bias VSUB is applied to the anodes of the APDs 41 in all the pixel cells 40.

The light exposure period corresponding to a first frame is a period from the light exposure start time ES1 to the light exposure end time EE1. In this period, a photon enters the pixel cell 40. At the light exposure end time EE1, the transfer transistor 44 is turned on, and as described with reference to FIG. 2, a detection result of the photon is output from the solid-state image sensor 100. In an output period DT1, detection results of photons for all the pixel cells 40 are sequentially output as an image of the first frame.

At the light emission start time TL2, the light source 124 emits light. In a specific pixel cell 40, when a reset operation of the reset transistor 43 in response to a reset signal RT is finished, a light exposure period starts. A light exposure period corresponding to a second frame is a period from a light exposure start time ES2 to a light exposure end time EE2. In this period, no photon enters the pixel cell 40. At the light exposure end time EE2, the transfer transistor 44 is turned on, and as described with reference to FIG. 2, a detection result of a photon is output from the solid-state image sensor 100. In an output period DT2, detection results of photons for all the pixel cells 40 are sequentially output as an image of the second frame. Thereafter, similar operations are repeated.

As described above, the frame number corresponds to a time (i.e., photon flight time) from an output of an optical pulse to a light exposure period of the solid-state image sensor. The duration of a photon flight time is set beforehand for each frame, and can be sequentially changed for each frame. Depending on setting of, for example, the photon flight time TF1, a distance from the imaging system to a subject whose images can be taken can be changed.

The signal processor 116 outputs an image from the solid-state image sensor 100 to the display 134. The display 134 displays an input image. The signal processor 116 may combine images of a plurality of frames output from the solid-state image sensor 100 and output the combined image. The signal processor 116 may combine images of frames corresponding to different photon flight times into one image, for example. In this case, the colors of the images may be different among the photon flight times. The signal processor 116 may reduce noise by, for example, averaging images of a plurality of frames corresponding to the same photon flight time.

Figure 8:
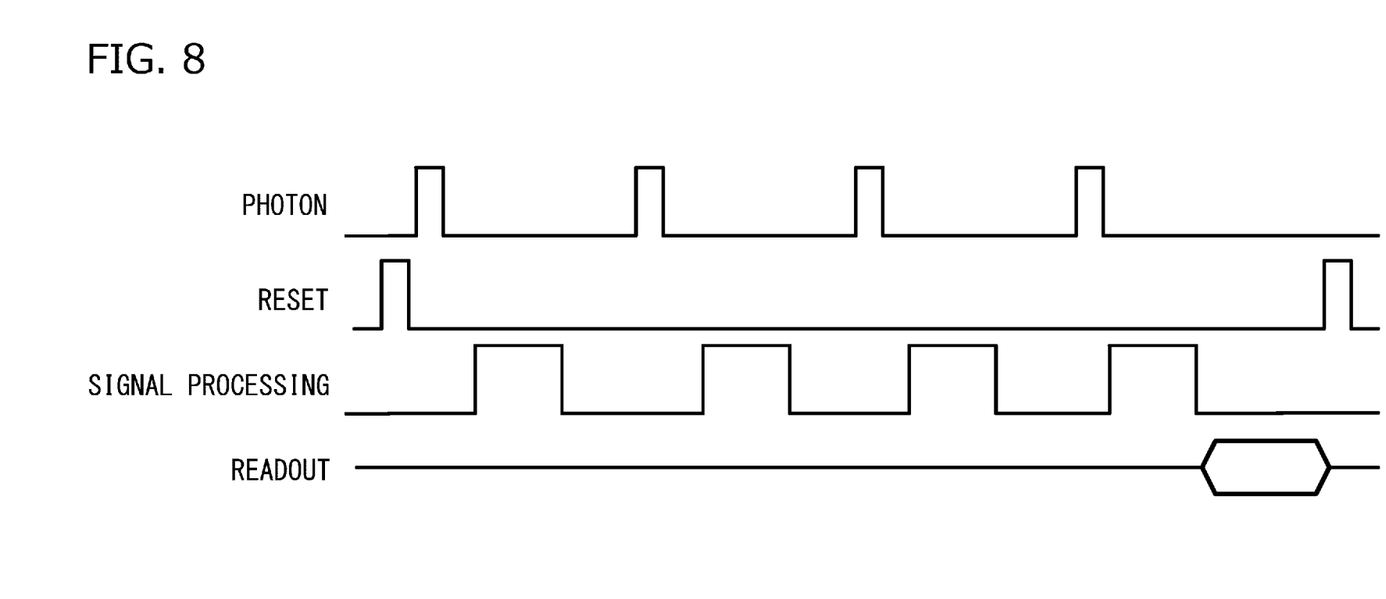
FIG. 8 is a timing chart showing example of signals in a typical solid-state image sensor.

FIG. 8 is a timing chart showing examples of signals in a typical solid-state image sensor. In the typical solid-state image sensor described above, at every entry of a photon, information indicating the entry of the photon is accumulated in a circuit in a pixel cell. Readout is performed at every time a plurality of photons is received. That is, an interval of readout is long, and a timing of flight of each photon cannot be known.

Figure 9:
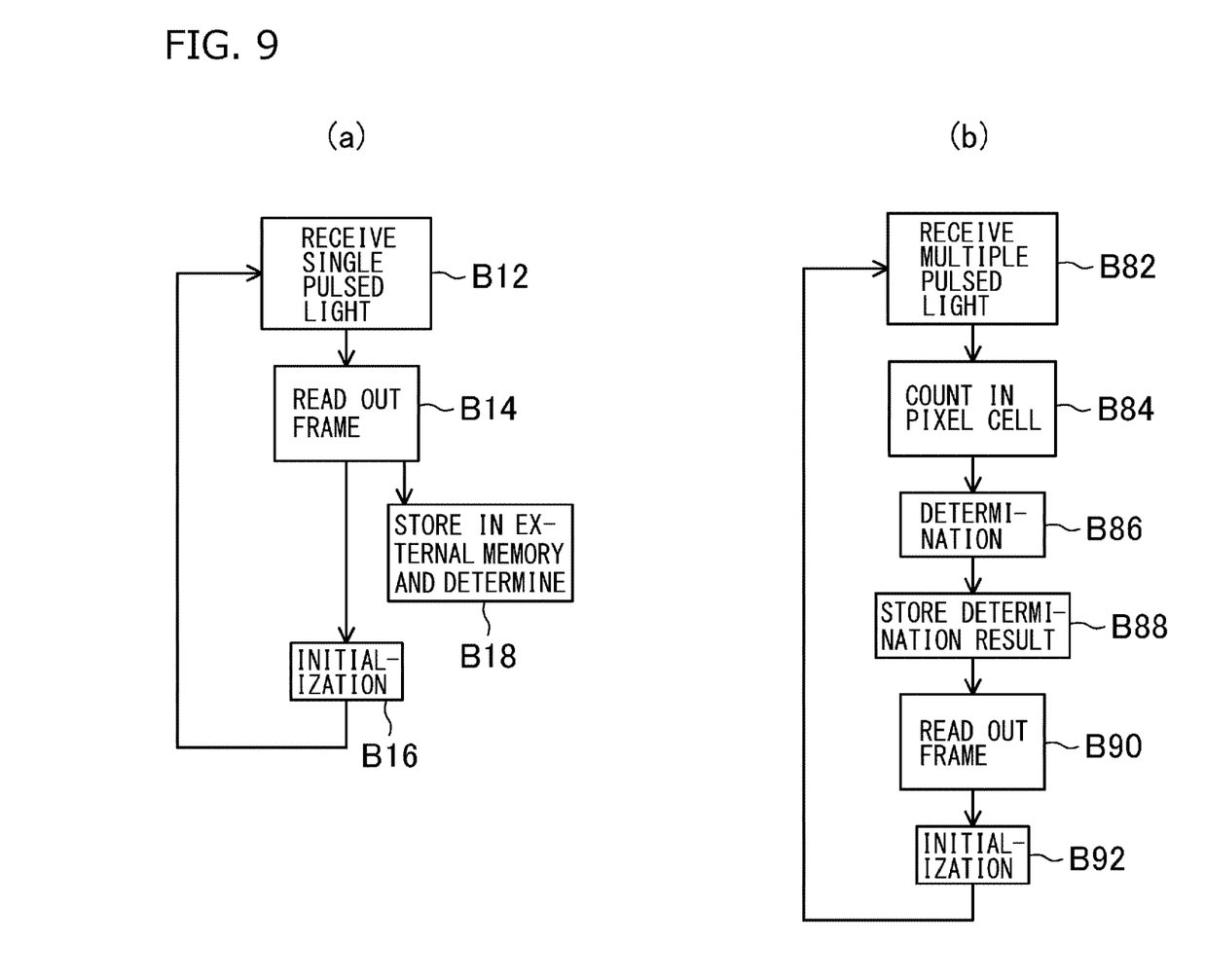
FIG. 9 illustrates portion (a) which is a flowchart depicting an example process in the solid-state image sensor according to the embodiment and portion (b) which is a flowchart depicting an example process in a typical solid-state image sensor.

Portion (a) of FIG. 9 is a flowchart depicting an example process in a solid-state image sensor according to this embodiment. After initialization, in a block B12, the solid-state image sensor 100 receives single pulsed light in one frame period. As described above, the pulsed light is light with which the number of photons entering each pixel cell 40 is, for example, one in average. In a block B14, the solid-state image sensor 100 outputs light reception information to the outside of the solid-state image sensor 100 as image data corresponding to one frame. In a block B18, the image data is stored in an external memory as necessary, and used for processing such as determination of a pixel value, for example. In a block B16, initialization is performed, and similar operation is repeated subsequently. With the configuration described above, the solid-state image sensor 100 performs frame readout for each single pulse, and thus, the interval of frames is not affected by a processing speed of, for example, determination performed outside the sensor 100, and data can be read out at high speed.

Portion (b) of FIG. 9 is a flowchart depicting an example process in a typical solid-state image sensor. After initialization, the solid-state image sensor receives a plurality of beams of pulsed light in a block B82. A circuit in each pixel cell of the solid-state image sensor counts the number of photons by this pulsed light in a block B84, determines a pixel value based on whether the counted number reaches a threshold or not in a block B86, and then stores the determination result in a memory in a pixel in a block B88. Thereafter, in a block B90, the solid-state image sensor outputs light reception information to the outside of the solid-state image sensor as image data for one frame. In a block B92, initialization is performed, and similar operation is repeated subsequently. In the typical solid-state image sensor, counting and determination of a pixel value are performed in the pixel cells based on a plurality of photons. Thus, as described above with reference to FIG. 8, an interval between readouts is relatively long.

Figure 10:
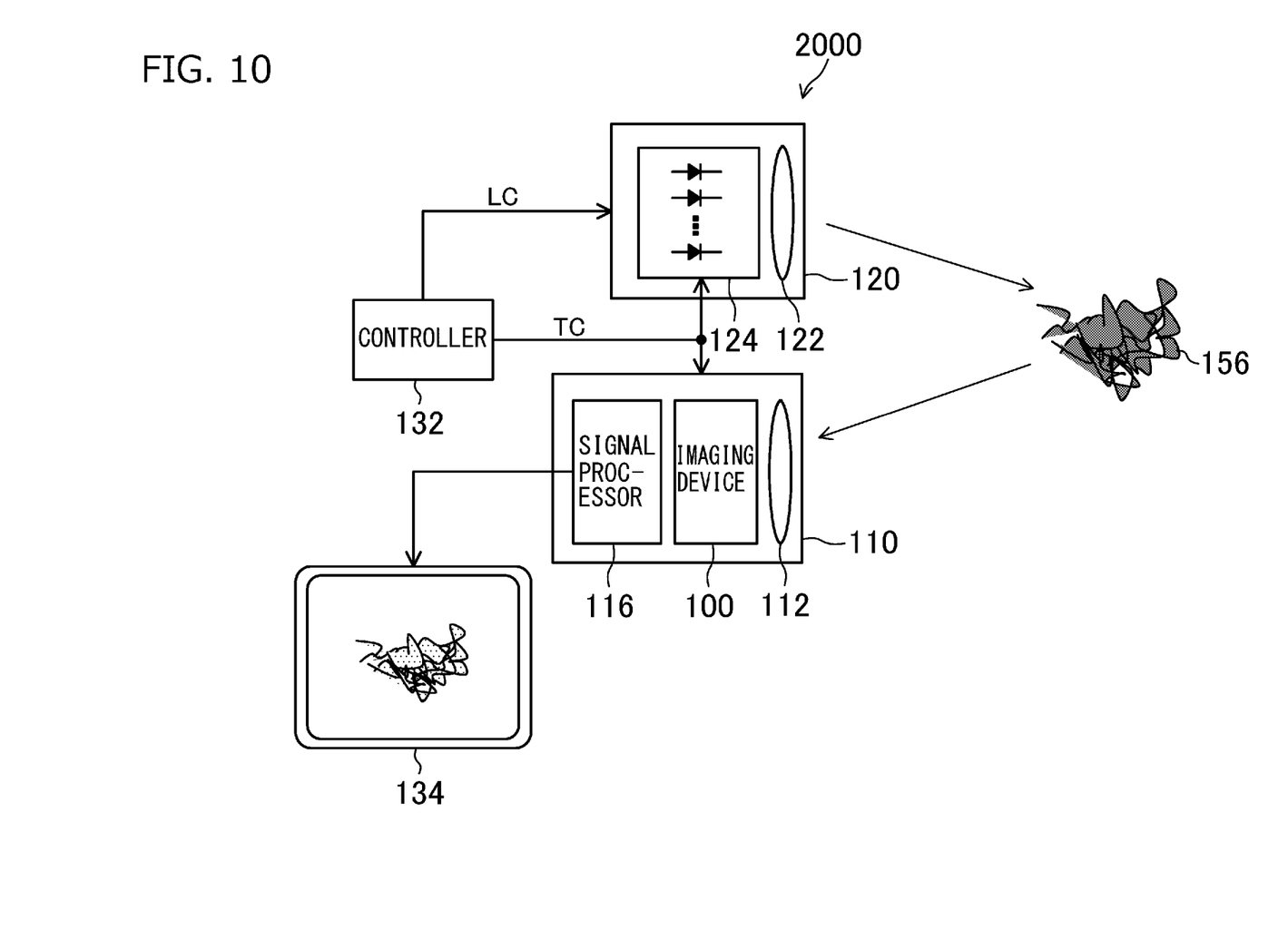
FIG. 10 is a block diagram illustrating another example of the imaging system according to the embodiment.

Another example of the system using the solid-state image sensor 100 will be described. FIG. 10 is a block diagram illustrating another example of the imaging system according to the embodiment. An imaging system 2000 illustrated in FIG. 10 is a system for detecting cell fluorescence, and is configured basically in the same manner as the imaging system 1000 illustrated in FIG. 6. Thus, aspects similar to those of the imaging system 1000 will not be described.

A controller 132 outputs a timing adjustment signal to a solid-state image sensor 100 and a light source 124. The light source 124 of a light projection device 120 emits light in pulses with a predetermined period in response to the timing adjustment signal, and projects the light to a cell sample 156 as a subject. Each pulsed light is absorbed in a light absorption group in the cell sample 156, and then, after a lapse of a specific time (lifetime) unique to the light absorption group, the light absorption group generates a fluorescent pulse. This fluorescent pulse enters the solid-state image sensor 100 through a light-receiving optical system 112.

A photon included in the fluorescent pulse flies to the solid-state image sensor 100 with a delay of the lifetime. Thus, it is possible to specify the type of the light absorption group included in the cell sample 156 by measuring the lifetime. In view of this, in the cell fluorescence detection system of this embodiment, timings of light emission in the light projection device 120 and light reception in the solid-state image sensor 100 are adjusted based on a timing adjustment signal TC from the controller 132.

The imaging system 2000 is different from the imaging system 1000 in obtaining an image corresponding to the lifetime of light absorption groups instead of a photon flight time. The frame number corresponds to a time from an output of an optical pulse to a light exposure period of the solid-state image sensor (i.e., the lifetime of the light absorption group). The duration of the lifetime is set beforehand for every frame, and can be sequentially changed for every frame. Depending on setting of the lifetime, the lifetime corresponding to the light absorption groups whose image can be taken from the imaging system can be changed.

A signal processor 116 outputs an image from the solid-state image sensor 100 to a display 134. The display 134 displays an input image. The signal processor 116 may combine images of a plurality of frames output from the solid-state image sensor 100 and output the combined image. The signal processor 116 may combine images of frames corresponding to different lifetimes into one image, for example. In this case, the colors of the images may be made different among the lifetimes. The signal processor 116 may reduce noise by, for example, averaging images of a plurality of frames corresponding to the same lifetime.

Figure 11:
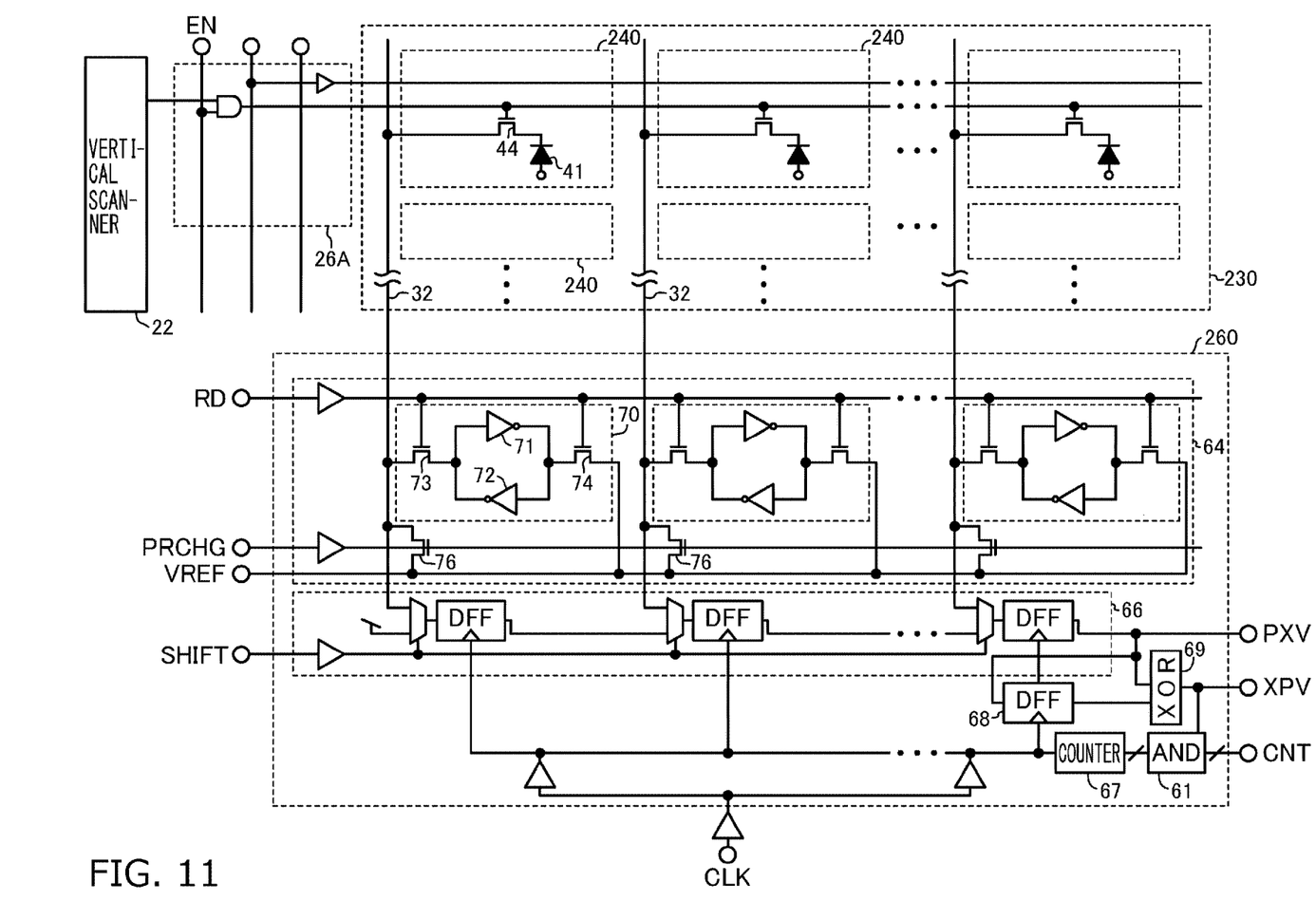
FIG. 11 is a circuit diagram illustrating another example configuration of the solid-state image sensor illustrated in FIG. 1.

FIG. 11 is a circuit diagram illustrating another example configuration of the solid-state image sensor 100 illustrated in FIG. 1. A solid-state image sensor 200 illustrated in FIG. 11 includes a pixel array 230 and a readout circuit 260 instead of the pixel array 30 and the readout circuit 60, and is configured in the same manner as the solid-state image sensor 100 except for including no load circuit 34. The pixel array 230 includes a plurality of pixel cells 240 arranged in rows and columns, for example. The readout circuit 260 includes the circuit illustrated in FIG. 5 in addition to the readout circuit 60. Each of the pixel cells 240 includes an avalanche photodiode (APD) 41 and a transfer transistor 44.

The APD 41 multiplies, by a bias electric field, electron-hole pairs generated by entry of a photon to a number (typically 100,000) sufficient for detecting the photon. The transfer transistor 44 is connected between a cathode of the APD 41 and a corresponding readout wire 32. When being selected by the vertical scanner 22, the transfer transistor 44 is turned on and transfers charges of the APD 41 to the readout wire 32. The APD 41 outputs charges in an amount sufficient for detecting the photon, and thus, the transfer transistor 44 transfers charges of the APD 41 directly to the readout wire 32. In other respects, the solid-state image sensor 200 is similar to the solid-state image sensor 100 described with reference to FIGS. 2 and 5, and thus, description thereof will not be repeated.

Since the solid-state image sensor 200 transfers charges of the APDs 41 directly to the readout wires 32, the amplifying transistors 45 are not needed. In addition, the APDs 41 are reset by the precharge circuits 76, and thus, the reset transistors 43 are not needed, either. Accordingly, in the solid-state image sensor 200, the pixel cells 240 can be further miniaturized, and power consumption can also be reduced.

The solid-state image sensor 200 may not include an AND circuit 61, a DFF 68, and an XOR circuit 69. The solid-state image sensor 200 may include the circuit illustrated in FIG. 4, instead of the AND circuit 61, the DFF 68, and the XOR circuit 69.

The solid-state image sensor 200 may be a photodetector including a single pixel cell instead of a pixel array.

Specifically, the solid-state image sensor 200 may be a photodetector including: a pixel cell; a pixel driving circuit configured to drive the pixel cell; and a readout wire for readout of an output from the pixel cell, where the pixel cell includes an avalanche photodiode configured to detect a photon by avalanche multiplication occurring when one photon enters, and a transfer transistor configured to transfer a detection result of the photon by the avalanche photodiode to the readout wire corresponding to the pixel cell, and for the pixel cell, the readout circuit determines whether a photon is detected or not based on a voltage of the readout wire corresponding to the pixel cell and outputs a detection result as a value of a pixel corresponding to the pixel cell.

The functional blocks herein can be typically implemented by hardware. Alternatively, a part or whole of the functional blocks may be implemented by software. For example, such functional blocks can be implemented by a processor and a program executable on the processor. In other words, each of the functional blocks herein may be implemented by hardware, software, or any combination of hardware and software.

The foregoing embodiment is merely a preferred example in nature, and is not intended to limit the disclosure, applications, and use of the application.

INDUSTRIAL APPLICABILITY

As described above, the present disclosure is useful for a solid-state image sensor and an imaging system, for example.

DESCRIPTION OF REFERENCE CHARACTERS 20 pixel driving circuit
30, 230 pixel array
32 readout wire
40, 240 pixel cell
41 avalanche photodiode
44 transfer transistor
60, 260 readout circuit
70 column amplifier
76 precharge circuit
100, 200 solid-state image sensor 110 imaging device (camera)
112 imaging optical system
116 signal processor
120 light projection device
1000, 2000 imaging system

The invention claimed is:

1. A solid-state image sensor, comprising:
a pixel array including a plurality of pixel cells;
a pixel driving circuit configured to drive the plurality of pixel cells;
a readout circuit configured to read data from the plurality of pixel cells and output an image constituted by pixels corresponding to the plurality of pixel cells; and
a plurality of readout wires corresponding to respective columns of the pixel cells, the plurality of readout wires connecting the pixel cell and the readout circuit to each other, wherein:
each of the plurality of pixel cells includes:
an avalanche photodiode configured to detect a photon by avalanche multiplication occurring when one photon enters, and
a transfer transistor configured to transfer a detection result of the photon by the avalanche photodiode to a corresponding one of the readout wires,
for each of the plurality of pixel cells of the pixel array, the readout circuit determines whether a photon is detected or not based on a voltage of one of the readout wires corresponding to the pixel cell, and outputs a determination result as a value of a pixel corresponding to the pixel cell, and
the readout circuit includes:
a precharge circuit configured to precharge the readout wires, and
a column amplifier configured to determine whether a photon is detected or not based on a voltage of the readout wire to which the detection result of the photon is transferred, the column amplifier being configured to change the voltage of the readout wire to one of two predetermined voltages corresponding to the determination result and hold the voltage.

2. The solid-state image sensor according to claim 1, wherein
the readout circuit outputs an address indicating a position of a pixel cell corresponding to the determination result.

3. The solid-state image sensor according to claim 2, wherein
the readout circuit outputs only the address of the pixel cell for which it is determined that a photon is detected.

4. The solid-state image sensor according to claim 2, wherein
the readout circuit outputs only the address of the pixel cell for which it is determined that a photon is not detected.

5. The solid-state image sensor according to claim 2, wherein
in a case where a detection result of a photon for one of the plurality of pixel cells is different from a detection result of a photon for a pixel cell adjacent to the one of the plurality of pixel cells, the readout circuit outputs the address of the one of the plurality of pixel cells.

6. An imaging system comprising:
a light projection device configured to output a train of optical pulses;
a camera configured to receive the train of optical pulses reflected on a subject; and
a controller configured to control the light projection device and the camera, wherein
the camera includes
an imaging optical system,
the solid-state image sensor according to claim 1 configured to receive the train of optical pulses reflected on the subject through the imaging optical system, and outputs images of a plurality of frames corresponding to respective optical pulses in the train of optical pulses, and
a signal processor configured to process an output of the solid-state image sensor,
for each of the plurality of frames, a relationship between a frame number and a time from an output of the optical pulse corresponding to the frame to a light exposure period corresponding to the frame of the solid-state image sensor is set beforehand, and
the signal processor obtains the time based on the frame number.

7. The imaging system according to claim 6, wherein
the controller controls the number of photons generated per the optical pulse, so that an average of the number of photons, which enter each of the plurality of pixel cells of the solid-state image sensor in the light exposure period, is one.

* * * * *